United States Patent [19]

Todd et al.

[11] Patent Number: 4,546,373
[45] Date of Patent: Oct. 8, 1985

[54] SEMICONDUCTOR DEVICE WITH A TANTALUM IRIDIUM BARRIER LAYER CONTACT STRUCTURE

[75] Inventors: Anthony G. Todd, Hertfordshire; Dennis K. Wickenden, London, both of England

[73] Assignee: The General Electric Company, p.l.c., England

[21] Appl. No.: 575,066

[22] Filed: Jan. 30, 1984

[30] Foreign Application Priority Data

Feb. 7, 1983 [GB] United Kingdom ............... 8303298

[51] Int. Cl.⁴ .................. H01L 23/48; H01L 23/56; H01V 3/00
[52] U.S. Cl. ........................ 357/67; 357/28; 357/34; 357/2; 357/71; 357/68; 357/65; 374/178; 307/310
[58] Field of Search ............. 374/178, 182; 357/28, 357/71, 67, 65, 34, 16, 2, 15; 307/310

[56] References Cited

U.S. PATENT DOCUMENTS 3,582,324  6/1971  Kunert ..................... 357/68
3,987,480 10/1976  Diguet ..................... 357/67
4,350,994  9/1982  Perepezko ................ 357/71

FOREIGN PATENT DOCUMENTS 0039625  3/1980  Japan ...................... 357/71
0135963 10/1981  Japan ...................... 357/28

OTHER PUBLICATIONS

IBM Technical Disclosure Bulletin, vol. 21, #4, Sep. 1978, p. 1753, by Ho et al.

Primary Examiner—Andrew J. James
Assistant Examiner—Mark Prenty
Attorney, Agent, or Firm—Kirschstein, Kirschstein, Ottinger & Israel

[57] ABSTRACT

In a temperature sensor of the kind comprising a bipolar transistor (1) having an adjustable constant current source (3) connected between its collector and base regions (7 and 9) and its emitter region (11) connected to the output of a high gain amplifier (5) whose input is derived from the current source (3), the junction between the emitter and base regions (11 and 9) of the transistor is a heterojunction and each of the emitter and base regions (11 and 9) is provided with a metal contact (17 or 19) separated from the associated region by a barrier layer (21 or 23) of an amorphous tantalum iridium alloy. The use of a heterojunction for the transistor emitter-base junction increases the temperature range of the sensor while the barrier layers ensure metallic stability at the high temperature end of the sensor temperature range.

6 Claims, 2 Drawing Figures

SEMICONDUCTOR DEVICE WITH A TANTALUM IRIDIUM BARRIER LAYER CONTACT STRUCTURE

This invention relates to temperature sensors.

A known form of temperature sensor comprises a bipolar transistor having an adjustable constant current source connected across its collector base junction and its emitter connected to the output of a high gain amplifier whose input is derived from the current source.

In operation of the sensor the emitter base voltage takes up a value dependent on various quantities including the value of the current supplied to the transistor by the current source and the absolute temperature of the transistor. However, for a change between given values of the current supplied by the constant current source the emitter base voltage changes by an amount dependent solely on absolute temperature. The sensor can thus be used as the basis of an absolute temperature thermometer.

If a conventional transistor based, say, on silicon is used in such a sensor, the relationship between change in emitter base voltage and absolute temperature for a given change of the current supplied by the constant current source is accurately linear over a range of temperature e.g. from 220° K. to 380° K. for a silicon based transistor. However, above this range the relationship becomes non-linear because of an increase in emitter reverse current, and below this range becomes non-linear because of increased resistance in the base region.

These shortcomings may be overcome by using a transistor in which the emitter base junction is a heterojunction, i.e. by using a transistor in which the emitter region consists of a material having a larger energy gap than the material of the base region. However, it has been found that an upper temperature limit then arises due to metallurgical instability at the metal-semiconductor interfaces between the emitter, base and collector regions and the electric contacts to these regions, i.e. migration of material from these contacts into the associated regions.

It is an object of the present invention to provide a temperature sensor wherein this problem is alleviated.

According to the present invention in a temperature sensor comprising a bipolar transistor having an adjustable constant current source connected across its collector base junction and its emitter connected to the output of a high gain amplifier whose input is derived from the current source, the emitter base junction of the transistor is a heterojunction and each of the emitter and base regions of the transistor is provided with a respective metal contact from which it is separated each emitter and base by a barrier layer of an amorphous tantalum iridium alloy.

Preferably the collector region is provided with a metal contact separated from the collector region by a barrier layer of an amorphous tantalum iridium alloy.

One temperature sensor in accordance with the invention will now be described, by way of example, with reference to the accompanying drawing in which.

Figure 1:
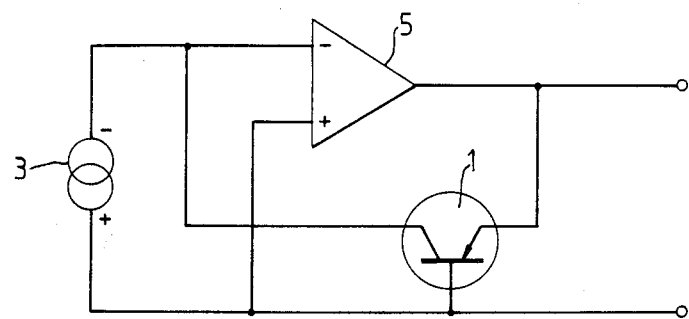
FIG. 1 is a schematic circuit diagram of the sensor.

Referring to FIG. 1, the sensor comprises a p-n-p bipolar transistor 1 and an adjustable constant current source 3 whose positive and negative terminals are respectively connected to the base and collector of the transistor 1. The sensor further includes an operational amplifier 5 whose non-inverting and inverting inputs are respectively connected to the positive and negative terminals of the current source and whose output is connected to the emitter of the transistor 1.

In operation of the sensor, with the source 3 set to supply a predetermined constant current, the emitter base voltage of the transistor 1 takes up a value dependent on various quantities including the current supplied by the source 3 and the absolute temperature of the transistor 1. However, when the current supplied by the source 3 changes, the emitter base voltage changes by an amount given by the expression:

$$KT/q \log(Ic1/Ic2)$$

where K is Boltzmann's constant;
Ic1 and Ic2 are the initial and final values of the current supplied by the source 3;
T is absolute temperature; and
q is the charge on an electron.

Thus, the change of emitter base voltage for a change between given values of the current supplied by the source 3 changes linearly with absolute temperature. An indication of absolute temperature may thus be obtained by measuring such changes in emitter base voltage.

Figure 2:
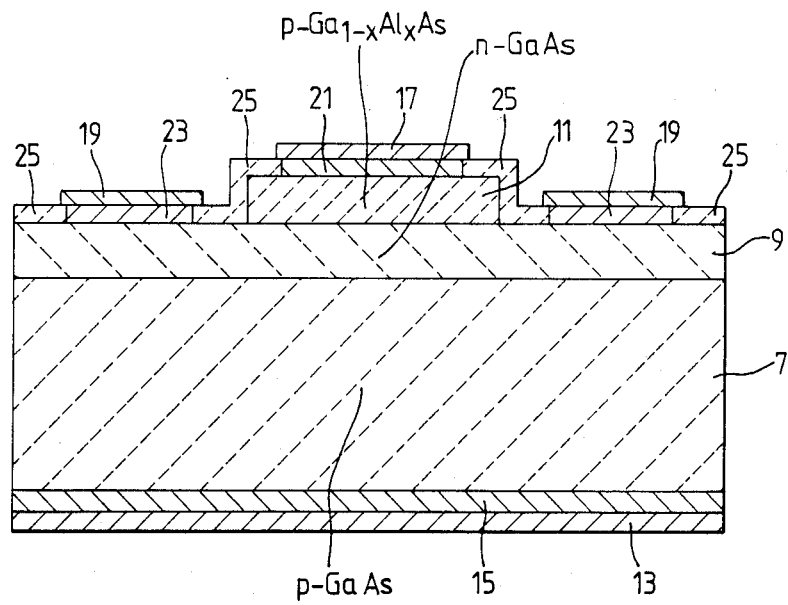
FIG. 2 is a diagrammatic sectional view of a transistor used in the sensor.

Referring now to FIG. 2, the transistor 1 comprises a substrate 7 of p-type gallium arsenide which constitutes the collector region of the transistor 1. The emitter region of the transistor 1 is constituted by a smaller layer 11 of p-type gallium aluminium arsenide ($Ga_{1-x}Al_xAs$) positioned centrally on the face of the layer 9 remote from the substrate 7.

The collector region is provided with a contact in the form of a layer 13 of gold separated from the face of the substrate 7 remote from the layer 9 by a layer 15 of an amorphous tantalum iridium alloy.

The emitter and base regions are similarly provided with contacts in the form of gold layers 17 and 19 respectively separated from the free faces of the layers 11 and 9 by respective barrier layers 21 and 23 of an amorphous tantalum iridium alloy, the layers 19 and 23 being of annular form.

The parts of the surfaces of the layers 9 and 11 not covered by the layers 21 and 23 are protected by a layer 25 of silicon nitride or silicon dioxide.

In operation of the sensor, the tantalum iridium barrier layers 15, 21 and 23 serve to prevent the migration of metal from the gold contact layers 13, 17 and 19 into the emitter base and collector regions of the transistor 1 up to much higher temperatures than would be the case in the absence of the barrier layers. As a result the sensor may be used to measure much higher absolute temperatures.

For a typical sensor of the form described by way of example the upper temperature limit is about 773° K. whereas in the absence of any barrier layers the upper temperature limit is about 573° K.

The barrier layers preferably consist of an amorphous tantalum iridium alloy containing between 40 and 70 atomic percent of tantalum, alloys with a tantalum content at the lower end of this composition range i.e. from 40 to 55 Atomic percent providing a better barrier to gold migration than those at the upper end of this range.

We claim:

1. A temperature sensor comprising: a bipolar transistor having an emitter base and collector regions, an adjustable constant current source connected between the collector and base regions of said transistor and a high gain amplifier having an input connected with said current source and an output connected to the emitter region of said transistor wherein the junction between the emitter and base regions of said transistor is a heterojunction and each of the emitter and base regions of said transistor is provided with a respective metal contact from which it is separated by a barrier layer of an amorphous tantalum iridium alloy.

2. A temperature sensor according to claim 1 wherein the collector region is provided with a metal contact separated from the collector region by a barrier layer of an amorphous tantalum iridium alloy.

3. A temperature sensor according to claim 1 wherein said amorphous tantalum iridium alloy contains between 40 and 70 atomic percent of tantalum.

4. A temperature sensor according to claim 3 wherein said amorphous tantalum iridium alloy contains between 40 and 55 atomic percent of tantalum.

5. A temperature sensor according to claim 1 wherein said base and collector regions comprise respectively n-type and p-type gallium arsenide and said emitter region comprises p-type gallium aluminium arsenide.

6. A temperature sensor according to claim 1 wherein said metal contacts comprise gold.

* * * * *